(12) United States Patent
Yamashita et al.

(10) Patent No.: US 6,271,460 B1
(45) Date of Patent: Aug. 7, 2001

(54) THERMO-ELECTRIC ELEMENT

(75) Inventors: Osamu Yamashita; Nobuhiro Sadatomi, both of Ibaraki (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/380,264

(22) PCT Filed: Dec. 24, 1998

(86) PCT No.: PCT/JP98/05853

§ 371 Date: Aug. 27, 1999

§ 102(e) Date: Aug. 27, 1999

(87) PCT Pub. No.: WO99/34450

PCT Pub. Date: Jul. 8, 1999

(30) Foreign Application Priority Data

Dec. 27, 1997 (JP) ...................................... 9-368826

(51) Int. Cl.[7] .................................................. H01L 35/30
(52) U.S. Cl. ........................................ 136/205; 136/236.1
(58) Field of Search .................................... 136/203, 205, 136/236.1, 238, 239, 240, 241, 227

(56) References Cited

FOREIGN PATENT DOCUMENTS 10-22530 * 1/1998 (JP).

OTHER PUBLICATIONS

Semiconducting Transition Metal Silicides: Electronic Structure, Electrical and Thermoelectrical Properties, H. Lange, St. Brehme, W. Henrion, A. Heinrich, G. Behr, H. Griessmann, A.B. Filnov, and V.E. Borisenko, 16th International Conference on Thermoel, No date available.*

Thermoelectric Figure of Merit of Impurity Doped And Hot–pressed Magnesium Silicide Elements, Tekenobu Kajikawa, Keisuke Shida, Kentaro Shiraishi, and Tetsuya Ito, 17 International Conference on Thermoelectrics, 1998, p. 362–369, No month available.*

C.B. Vining, Thermoelectric Properties of Silicides, CRC handbook of Thermoelectrics, 280–281 (1995), No month available.*

* cited by examiner

*Primary Examiner*—Kathryn Gorgos
*Assistant Examiner*—Thomas H Parsons
(74) *Attorney, Agent, or Firm*—Dykema Gossett PLLC

(57) ABSTRACT

With the thermo-electric conversion element according to the present invention, the power generating efficiency (in other words, the conversion efficiency) can be improved by inserting as metallic film made of either Ag, Al, or silver soldering material for the PN junction formation between the Si based P type and N type semiconductors and inserting a metallic film made of either Zn, Ni, Cu, Ag, Au, or Cu-30Zn at a connecting portion between the semiconductors and lead wires, so that the electromotive power and the thermo-electromotive force are not cancelled each other due to the Schottky barrier which is generated at the interfacial area between the metals and semiconductors. The desired thermo-electric conversion efficiency can be achieved by the material presented in this invention without any deterioration of the original thermo-electric properties.

32 Claims, 1 Drawing Sheet

DIRECTION OF TEMPERATURE GRADIENT

THERMO-ELECTRIC ELEMENT

BACKGROUND OF THE INVENTION

1. Field of the Invention

The present invention relates to thermo-electric conversion elements which are constructed with a PN junction formed of a P type semiconductor and an N type semiconductor made of the new type of Si-based alloy system thermo-electric conversion material which has various alloying elements to a Si parent phase. More specifically, the present invention relates directly to a novel thermo-electric conversion element with which the thermo-electric conversion efficiency is improved by modifying the junction metal used for the PN junction portion and a joining metal employed between the semiconductors and lead wires.

2. Description of the Related Art

Thermo-electric conversion elements are currently in great demand for the effective application of a high thermal energy. Such devices can be found in systems that convert exhaust heat to electric energy, in small-scale portable power generators used outdoors, or in flame sensors which can be installed in equipment carrying and dealing with a gas.

However, it is generally believed that conventional thermo-electric conversion elements possess poor conversion efficiency. Moreover, the usable temperature range is relatively narrow, which is another drawback associated with conventional thermo-electric conversion elements. Furthermore, the production process is rather complicated, resulting in a high cost. These drawbacks make conventional conversion elements limited in their uses.

The efficiency in converting heat energy to electric energy can be expressed as a function of an efficiency index, ZT. Accordingly, when the index ZT is higher, the conversion efficiency will increase. The efficiency index, ZT, can be defined from the following equation (1);

$$ZT=\alpha^2\sigma T/K \quad (1)$$

where the term "$\alpha$" is a Seebeck coefficient of the thermo-electric material, $\sigma$ is the electric conductivity, K is thermal conductivity, and T is an absolute temperature of the thermo-electric element which is averaged out over the high temperature side ($T_H$) and low temperature side ($T_L$).

A type of thermo-electric conversion element having the highest efficiency index is a Skutterudite type $IrSb_3$ (T. Caillet, A. Borshchrysky and J. P. Fleurial: Proc. 12th Int. Conf. on Thermoelectrics, Yokohama Japan, 1993, page 132). It was reported that the ZT value of the Skutterudite $IrSb_3$ is approximately 2.0. However, due to the extremely high cost of the raw material of the Ir element, this type of thermo-electric conversion element is not practical.

On the other hand, an Si—Ge alloy system and an Fe—Si alloy system are thought to be the most promising alloy systems from the viewpoints of cost and environmental considerations. However, although an Fe—Si alloy system possesses a relatively high value of Seebeck coefficient, the electric resistance is high and the efficiency index, ZT, is less than 0.2. Hence an Fe—Si alloy system does not have all characteristics required for a desirable material which can be used as a thermo-electric conversion element.

With an Si—Ge alloy system, the Ge content generally ranges from 20 to 30 atomic %. The material cost of the Ge element is high and the Ge element is prone to segregate, so that it is hard to produce a uniform material. In addition to these problems, there are several drawbacks in characteristics; namely the Si—Ge alloy system exhibits a high value of Seebeck coefficient at high temperature, and its efficiency index, ZT, is about 1.0 at 1,200K since the electric resistance is high although the thermal conductivity of the Si—Ge alloy system is low. As a result, all necessary requirements for a promising thermo-electric conversion element are not met.

The present inventors found that, by adding various alloying elements to Si-based material, the Seebeck coefficient can be equal or higher to that obtained from conventional alloy systems such as an Si—Ge system or an Fe—Si system. More specifically, this novel Si-based alloy system possesses much higher values of the carrier concentration when compared to those found in an Si—Ge alloy system or an Fe—Si alloy system. Based on these fundamental findings, P type semiconductors and N type semiconductors in which various alloying elements are added to Si-based material have been proposed as a promising Si-based alloy system thermo-electric conversion material which exhibits excellent producability, a stable quality, low cost, and high value of efficiency index.

Namely, by adding various amounts of certain types of properly selected alloying elements to the Si-based material in order for the Seebeck coefficient to show the maximum value in a range of the carrier concentration from $10^{19}$ to $10^{21}$ ($M/m^3$), and by adding elements which are heavier than Ge element to the Si-based material, the present inventors have found that the thermal conductivity can be reduced greatly, resulting in a remarkably improved efficiency index which is much higher than that obtained from an Si—Ge alloy system.

However, there are several additional factors which are important for enhancing the thermo-electric conversion efficiency of the thermo-electric conversion elements in both conventional types and novel Si-based alloy systems. The important factors can include a junction between the metallic electrode components and semiconductors at a PN junction procedure and the condition of joining interface between the semi-conductors and lead wires; in other words, the difference in the Fermi energy (Ef) level between the semi-conductor and metal.

According to the currently employed procedures, the junction between bulk materials is made through the silver solder or transition metallic elements. For manufacturing the junction through the powder metallurgical technique, powders of the P type semiconductor and N type of semiconductor are directly subjected to a press-forming method and joined together. By either way, the thermo-electromotive force is largely affected by the joining conditions.

Since the thermo-electric conversion element is usually exposed to extreme variations in temperature, the joint portion may be cracked or fractured due to the thus-generated thermal stress. Hence, the overall properties of the thermo-electric conversion element is largely influenced by the joining technology. It may be necessary to develop and design a suitable type of joining components corresponding to material types of semiconductors.

SUMMARY OF THE INVENTION

As a consequence, in order to overcome the problems found in conventional types of thermo-electric conversion elements, it is an object of the present invention to provide a thermo-electric conversion element which has a PN junction structure to generate a high thermo-electromotive force and a junction structure between the semi-conductors and lead wires. The present invention has the further object of improving the themo-electric conversion element which is formed of a PN junction structure of a P type semiconductor and an N type semiconductor including the conventional type of Si-based thermo-electric conversion element as well as novel type of Si-based thermo-electric conversion element.

The thermo-electromotive force is defined, in principle, by the temperature difference between the temperature at the high temperature end which is heated of the thermo-electric material and the temperature at the low temperature end thereof. The majority of the research and development of these thermo-electric materials is concentrated on the semiconductor itself and the intermetallic compound which exhibits semiconductor characteristics. The main reasons for such research activities and trends are due to the fact that (1) the thermal conductivity can be controlled to a lower value than the metals or half metals, and (2) a relatively high energy density can be easily obtained at the donor level or acceptor level by adding various additives. As a result, the high value of Seebeck coefficient can be attained, which has an advantage.

In contrast with the above, the higher the energy density of the semi-conductor is, the more easily the Schottky barrier can be generated which is proportional to the Fermi energy levels (Ef) of respective metal material and semiconductors when these components are joined. As a result of generating of the voltage which has an opposite sign from that of the thermo-electromotive force is generated, the thermo-electric conversion efficiency is greatly deteriorated.

As a consequence of the aforementioned, the present inventors have come to a concept that the thermo-electromotive force will not be degraded and the high level of thermo-electric conversion efficiency can be realized as the same level as expected from the efficiency index, if a joining material is appropriately chosen in such a way that the material has a Fermi energy level (Ef) close to that of the semi-conductors; namely material which has nearly same work function as that of the semi-conductors.

In order to increase the thermo-electric conversion efficiency, it is necessary not only to improve the thermo-electric conversion material, but also to develop the metal or alloy applicable as the junction material. If the junction material is not properly selected with corresponding to the material for the thermo-electric conversion function, the thermo-electromotive force can not effectively be generated even if the thermo-electric conversion material with a high level of efficiency index is employed. At the same time, the junction material for joining the lead wires and other end of the semi-conductor should be properly chosen in a same manner as done for choosing the junction materials for the thermo-electric conversion materials.

The present inventors have previously disclosed that, when an element from the second or third group or an element from the fifth or sixth group is added to a Si based material in such a way that the resultant carrier concentration in the semiconductor is in a range from $10^{19}$ to $10^{21}$ (M/$^3$), the electric conductivity is reduced and the Seebeck coefficient exhibits its maximum value, so that the efficiency index increases remarkably, as described in the above.

The present inventors have investigated on various types of materials for P type and N type semi-conductors, using the aforementioned Si based semiconductor showing an extremely high level of the efficiency index. It was found that the resultant thermo-electromotive force depends upon the junction metal at the joining portion. Furthermore, it was observed that the thermo-electric conversion element with a high level of the thermo-electromotive force can be manufactured by selecting a metallic material as a joining material at the junction which has a similar level of the work function as that of the semiconductor. In addition to all these findings which were obtained during the research and development, the present invention has been completed after finding that the thermo-electromotive force depends also upon the type of joining material which is employed for joining semiconductors and lead wires.

Namely, the present invention provides a thermo-electric conversion element which is formed with a PN junction at each end of respective P type and N type semi-conductors which are fabricated through in single or compound of alloying element(s) to a Si based material. More specifically, the PN junction is made by at least one type of metal or alloy which is properly chosen from a material group consisting of Ag, Al or silver solder. Furthermore, the electrode on the leads wire side of the semi-conductor is joined to lead wires with at least one type of metal or alloy which is properly selected from a material group consisting of Zn, Ni, Cu, Ag, and Au elements.

Moreover, in a course of developing a Si based thermo-electric conversion material with a novel composition and having a high level of efficiency index, P type and N type semiconductors were fabricated by adding various elements to Si based material which has a diamond structure, and the relationship between the addition amount and the thermo-electric properties was examined. It was concluded that although the Seebeck coefficient decreases with increasing the carrier concentration up to $10^{18}$ (M/m$^3$), it increases toward to the narrow window of carrier concentration of $10^{18}$~$10^{19}$ (M/m$^3$). As a result of further detailed investigation, it was found that the efficiency index in the Si based alloy system exhibits its maximum value at a range of carrier concentration of $10^{19}$~$10^{21}$ (M/m$^3$).

During the above mentioned research activities, following elements and addition amount were evaluated in a great details; namely, they include the element group A (Be, Mg, Ca, Sr, Ba, Zn, Cd, Hg, B, Al, Ga, In, Tl) as alloying element to produce the P type semiconductors, and the element group B (N, P, As, Sb, Bi, O, S, Se, Te) as alloying elements to fabricate the N type semiconductors. The relationship between the addition amount and the thermo-electric characteristics was also examined.

Previously, by controlling the carrier concentration by adding various impurity elements to Si semiconductors which has a diamond structure, it was found that (1) the electric resistance reduces, (2) the Seebeck coefficient was improved, and (3) the efficiency index is remarkably increased without any deterioration of properties which a single Si based material originally possesses; leading to a novel Si based thermo-electric conversion material of P type and N type semiconductors.

In general, taking consideration of versatile applications of the thermo-electric conversion material, there could include various conditions such as the heat source, location and style of usage, and levels of current and voltage. According to these influencing factors, it is required to choose which property out of the Seebeck coefficient, electric resistance, or thermal conductivity should be considered as the most important one. According to the present invention, the carrier concentration can be selected and defined by the addition amount of properly selected element (s) in the thermo-electric conversion material.

For example, a P type semiconductor can be fabricated with a carrier concentration of $10^{17}$~$10^{20}$ (M/m3) by adding 0.001 atomic % ~0.5 atomic % in single or compound of alloying element(s) A, as listed previously. Another P type semi-conductor can be produced with a carrier concentration level of $10^{19} \sim 10^{21}$ (M/m$^3$) by adding 0.5 atomic % ~5.0 atomic % of the alloying element A.

Similarly, an N type semiconductor can be formed with a carrier concentration of $10^{17} \sim 10^{20}$ (M/m$^3$) by adding 0.001 atomic % ~0.5 atomic % in single or compound of alloying element(s) B. Another N type semiconductor can be fabricated with a carrier concentration level of $10^{19} \sim 10^{21}$ (M/m$^3$) by adding 0.5 atomic % ~10 atomic % of the alloying element B.

An excellent thermo-electric conversion efficiency can be obtained by adding 0.5 atomic % ~5.0 atomic % of the alloying element A or 0.5 atomic % ~10 atomic % of the alloying element B in order to keep the carrier concentration level in a range of $10^{19} \sim 10^{21}$ (M/m3). However, it is expected to improve the efficiency index furthermore by reducing the thermal conductivity to less than 100 W/mK at room temperature, furthermore less than 50 W/mK, moreover preferably less than 20~50 W/mK.

In order to achieve the reduction of the thermal conductivity, the adding effect of elements to Si based material was investigated. At least one element selected from the third-group and at least one element chosen from the fifth-group were co-added to Si base material, so that the atomic arrangement can be rearranged randomly without changing the carrier concentration of $10^{19} \sim 10^{21}$ (M/m$^3$), resulting in that the thermal conductivity was reduced down to 30~90% to show less than 50 W/mK at room temperature.

Previously, it was discovered by the present inventors that, in the aforementioned thermo-electric conversion material, the P type semiconductors can be fabricated by adding the third group element with 0.3~5 atomic % more than the fifth group element. At the same time, if the fifth group element was added with 0.3~5 atomic % more than the third group element, the N type semiconductors can be made.

While the present inventors were investigating effective alloying element(s) to reduce the thermal conductivity other than the third group and the fifth group elements as described above, it was found that atoms involved can be randomly arranged without changing the carrier concentration in Si based material by adding the third-fifth group chemical compound semiconductor or the second-sixth group chemical compound semiconductor to Si based material and furthermore adding at least one element from the third group or the fifth group element for purpose of controlling the carrier concentration level in a range from $10^{19}$ to $10^{21}$ (M/m$^3$), so that the thermal conductivity can be less than 100 W/mK at room temperature and therefore, the thermo-electric conversion material with a high efficiency can be fabricated.

Moreover, as a result of investigating on effects of other alloying element(s) on Si based material, the fourth group elements such as Ge, C, or Sn with 0.1~5 atomic % is added to Si based material in order to substitute a portion of Si atoms by the same fourth group element having a different atomic weight, resulting in that the phonon scattering in the crystals became large and the thermal conductivity of the resultant semiconductors decreases down to 20~90 %; namely it is less than 100 W/mK at room temperature. Furthermore, it was discovered that another type of thermoelectric conversion material as P type semiconductor can be fabricated to which 0.1~5 atomic % of the third group element was added. Moreover another type of thermoelectric conversion material as an N type semiconductor can be produced to which 0.1~10 atomic % of the fifth group element is added.

After the research on other possible alloying element(s) other than the third and fifth group elements effective to Si based material for the novel thermo-electric conversion material as mentioned above, it was found that, although there is no specific limitations if an alloying element can help to produce P type or N type semiconductors, preferably any element can be selected whose ionic diameter is relatively compatible to that of Si based element since most of the element will be precipitated at grain boundaries if the ionic diameter of the element is quite different from that of the Si base element. For effective alloying element to fabricate P type semiconductors and effective alloying element to produce N type semiconductors, the following listed element group α (as a P type semiconductor former) and element group β (as an N type semiconductor former) can be alloyed in single or compound mixing manner.

As to the element group α, there are alloying elements group A (Be, Mg, Ca, Sr, Ba, Zn, Cd, Hg, B, Al, Ga, In, Tl) and transition metal elements group $M_1$ (Y, Mo, Zr). For the element group β, there are alloying elements group B (N, P, As, Sb, Bi, O, S, Se, Te), transition metal elements group $M_2$ (Ti, V, Cr, Mn, Fe, Co, Ni, Cu, Nb, Ru, Rh, Pd, Ag, Hf, Ta, W, Re, Os, Ir, Pt, Au; note: Fe should be less than 10 atomic %), and rare earth elements group RE (La, Ce, Pr, Nd, Pm, Sm, Eu, Gd, Th, Dy, Ho, Er, Yb, Lu).

Furthermore, the present inventors have previously discovered that the element selection from the above listed each group for the a element as a P type semiconductor former and the β element as an N type semiconductor former can be done arbitrarily within the following limitations. Namely, at least one element from each element group for respective α and β elements is selected and the total amount should be in a range from 0.002 atomic % to 20 atomic %. Furthermore, in order to fabricate a P type semiconductor, the total amount of the a element should be more than the total amount of the β element.

Using these Si based semiconductors, P type and N type semiconductors are fabricated. After forming the PN junction through the joining metal of the present invention, and connecting semiconductors and lead wires to said joining metal of the present invention, the thermo-electric conversion element with a high thermo-electromotive force can be fabricated.

The above and many other objectives, features and advantages of the invention will be fully understood from the ensuing detailed description of the examples of the invention, which description should be read in conjunction with the accompanying drawings.

DETAILED DESCRIPTION OF THE PREFERRED EMBODIMENTS

In general, there are no technical problems involved in a direct bonding P type and N type semiconductors through the powder metallurgical technique. In a case of joining the bulk material by silver soldering materials or the like, the resultant thermo-electromotive force can be varied depending upon the thermo-electric power between the semiconductor and metal.

Namely, when the Fermi energy level of the metal and the Fermi energy level of the P type or N type semiconductor differ greatly from each other, a Schottky barrier will be formed between the metal and semiconductor. As a result, an electromotive force with an opposite sign will be generated in order to cancel the thermo-electromotive force which is generated by the Seebeck effect.

This phenomenon can be found similarly in metallic materials which are employed for connecting the semiconductor and lead wires. Various metals and alloy systems have been investigated to find proper material types for the PN junction as well as connecting materials used for lead wires and semiconductors.

It was found by the present inventors that Ag, Al, their alloys, or silver soldering material can be preferably used for the PN bonding of P type and N type semiconductors to both of which various alloying elements are added to Si based material. At the same time, it was discovered that at least one single metal or its alloy properly selected from a material group consisting of Zn, Ni, Cu, Ag, or Au can be effectively used for connecting semiconductors and lead wires. Accordingly, the thermo-electric conversion element having a high efficiency can be fabricated.

Figure 1:
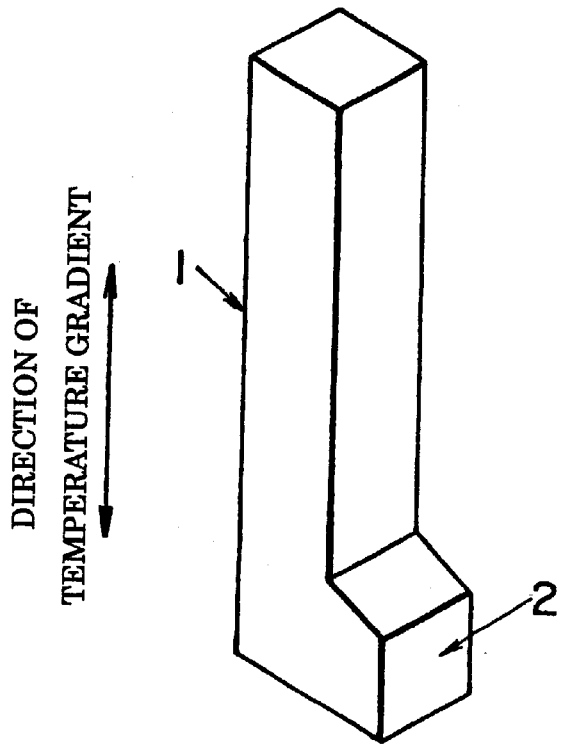
FIG. 1 is a perspective view of one preferred embodiment of a thermo-electric conversion element according to the present invention, an arrow mark indicating the direction of the temperature gradient.
Figure 2:
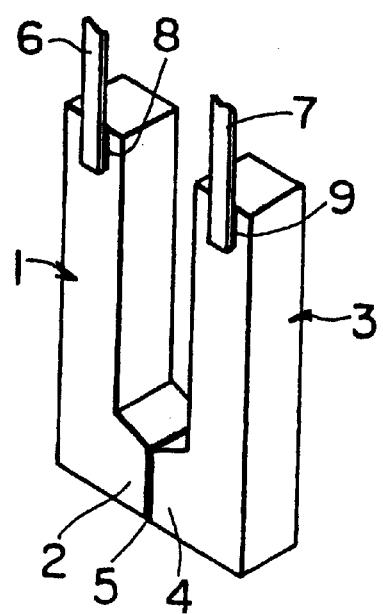
FIG. 2 is a perspective view of another preferred embodiment of a thermo-electric conversion element according to the present invention.

In order to produce Si based P type and N type semiconductors, high pure raw elements with a predetermined amount are added to Si(10N: ten nines purity) as listed in Tables 1 and 2, followed by an arc-melting in a button-shaped ingot. The P type semiconductor 1 and N type semiconductor 3 are furthermore formed into L-shapes, as seen in FIGS. 1 and 2. For a PN a junction, a metallic film composed of at least one element of Ag, Al or silver soldering material is formed on both extruded end portions 2. Similarly, on connecting terminals 8,9 of lead wire side 6,7 of the respective P type and N type semiconductors, a metallic film is formed using either one of Zn, Ni, Cu, Ag, Au, Cu-30Zn alloy.

With regard to forming methods of the metallic film, the film can be formed by the vapor deposition or sputtering materials on both end faces. As an alternative method, a metallic foil can be inserted between the extruded end portions 2,4 of respective P type and N type semiconductors when they are in a stage of a press-bonding process to construct the entire thermo-electric conversion element. The preferable thickness of metallic film or the metallic foil can be in a range from 1 to 20 $\mu$m.

In order to form the PN junction, a metallic film 5 or metallic foil which is made of Ag, Al or silver soldering material is inserted between the extruded end portions 2,4 of respective P type and N type semiconductors. The thus prepared couples are pressed in vacuum or inert gaseous atmosphere at pressure of 100~400 kg/cm$^2$, at a temperature of 400~900° C. for 5~20 minutes while squeezing both semiconductors 1,3 with ceramic squeezing jigs.

After the aforementioned press-bonding procedure, the U-shaped thermo-electric conversion element can be completed in which the bonded portion is a high temperature portion and both other end portions of respective P type and N type semiconductors 1,3 are low temperature portions.

For the connecting portions 8,9 for the lead wires and semiconductors, a metallic film is formed on semiconductors in a similar manner taken for the PN junction. The formed metallic film is furthermore press-bonded to the flat portions of lead wires. Moreover, in a case when the press-bonding does not provide sufficient bond strength, any organic bonding agent such as resins can be applied to enhance the bond strength, since the connected portion between the lead wires and semiconductors is used at room temperature after cooling.

1. Composition in general

As a P type semiconductor forming element, there are alloying elements A (including Be, Mg, Ca, Sr, Ba, Zn, Cd, Hg, B, Al, Ga, In, and Tl). It is possible to enhance the Seebeck coefficient by controlling the carrier concentration by adding in single or compound of any one of these alloying elements.

When the electric conductivity and thermal conductivity are required to be sufficiently reduced by either single or compound, it is preferable to control the carrier concentration level at a range from $10^{17}$ to $10^{20}$ (M/m3), so that the addition amount will be preferably 0.001~0.5 atomic %.

For the P type semiconductors, if the addition amount is less than 0.001 atomic %, the resultant carrier concentration will be less than $10^{17}$ (M/m3), so that the expected improvement on the efficiency index was not achieved since the electric conductivity is too small and the thermal conductivity is still high. On the other hand, if the addition amount exceeds 0.5 atomic %, it is not a suitable amount to accomplish the object because a portion of alloying element is not completely substituted in crystals with Si atoms so that a different crystal will be precipitated, resulting in reducing the Seebeck coefficient. Accordingly, in order to reach the desired level of a high Seebeck coefficient, the addition amount of selected alloying element(s) should be in a range of 0.001~0.5 atomic %.

Moreover, in order to improve the Seebeck coefficient along with the reducing the electric conductivity of the P type semiconductors, it is preferable to control the carrier concentration at a range of $10^{19}$ to $10^{21}$ (M/m$^3$) and the addition amount of 0.5~5.0 atomic % will be appropriate. If the addition amount is less than 0.5 atomic %, the carrier concentration will be also less than $10^{19}$ (M m$^3$), so that the efficiency index can not be improved since the electric resistance is not greatly reduced and the thermal conductivity is still too high. On the other hand, if the addition amount exceeds 5.0 atomic %, it is not a suitable amount to accomplish the object because a portion of alloying element is not perfectly substituted in crystals with Si atoms so that a different crystal will be precipitated, resulting in reducing the Seebeck coefficient. Accordingly, in order to reach the desired level of high Seebeck coefficient, the addition amount of selected alloying element(s) should be in a range of 0.5~5.0 atomic %.

On the other hand, for the N type semiconductor forming elements, there are alloying elements B (including N, P, As, Sb, Bi, O, S, Se, and Te). It is possible to enhance the Seebeck coefficient by controlling the carrier concentration by adding in single or compound of any elements listed in the above. When the electric conductivity and thermal conductivity are required to be sufficiently reduced by adding in single or compound of any alloying element which is properly selected from the element group B, it is preferable to control the carrier concentration in a range from $10^{17}$ to $10^{20}$ (Mm$^3$) and to control the addition amount in a range from 0.001 to 0.5 atomic %.

In a case of the N type semiconductors, if the addition amount is less than 0.001 atomic %, the resultant carrier concentration is also less than $10^{17}$ (M/m$^3$), so that the required coefficient index can not be achieved because the electric conductivity is not sufficiently reduced and the thermal conductivity is still too high. Furthermore, if the addition amount exceeds 5.0 atomic %, it is not a suitable amount to accomplish the object because a portion of alloying element is not completely substituted in crystals with Si atoms so that a different crystal will be precipitated, resulting in reducing the Seebeck coefficient. Accordingly, in order to reach the desired level of high Seebeck coefficient, the addition amount of selected alloying element (s) should be in a range of 0.001~0.5 atomic %.

Moreover, in order to improve the Seebeck coefficient along with reducing the electric conductivity of the P type semiconductors, it is preferable to control the carrier concentration at a range of $10^{19}$ to $10^{21}$ (M/m$^3$) and the addition amount of 0.5~10 atomic % will be appropriate. If the addition amount is less than 0.5 atomic %, the carrier concentration will be also less than $10^{19}$ (Mim$^3$), so that the efficiency index can not be improved since the electric resistance is not greatly reduced and the thermal conductivity is still too high. On the other hand, if the addition amount exceeds 10 atomic %, it is not a suitable amount to accomplish the object because a portion of alloying element is not completely substituted in crystals with Si atoms so that a different crystal will be precipitated, resulting in reducing the Seebeck coefficient. Accordingly, in order to reach the desired level of high Seebeck coefficient, the addition amount of selected alloying element(s) should be in a range of 0.5~10 atomic %.

2. Composition aiming at a reduction of the thermal conductivity

In order to reduce the thermal conductivity of the aforementioned material to be less than 100 W/mK at room temperature, to enhance the efficiency index ZT, and to produce the Si based thermo-electric conversion material having a high efficiency, the following various type of elements as well as compounds can be appropriately selected as an alloying element to Si based material; namely they include the third group element (B, Al, Ga, In, and Tl), the fifth group element (N, P, As, Sb, and Bi), the third-fifth group chemical compound semiconductor (AlP, AlAs, AlSb, GaN, GaP, GaAs, GaSb, InP, InAs, InSb or the like) and the second-sixth group chemical compound semi-conductor (ZnO, ZnS, ZnSe, ZnTe, CdS, CdO, CdSe, CdTe or the like).

When the third group element and the fifth group element are simultaneously added to the Si based material, each element from each group can be in single or compound for the purposes of controlling the carrier concentration and improving the Seeback coefficient. It is desirable to control the carrier concentration in a range from $10^{19}$ to $10^{21}$ (M/m3) and the total addition amount in a range from 1 to 20.0 atomic %.

Moreover, when at least one element from the third group element or the fifth group element along with the third-fifth group chemical compound semiconductor or the second-sixth group chemical compound semiconductor is needed to be added, the element from the third and fifth group elements as well as the addition amount should be appropriately chosen in order to control the carrier concentration level in a range from $10^{19}$ to $10^{21}$ (M/m$^3$). Namely, it is preferable to select and add at least one element from the third group or the fifth group element with a concentration range of 1~10 atomic % and the third-fifth group chemical compound semiconductor or the second-sixth group chemical compound semiconductor with a concentration range of 1~10 atomic %.

If the P type semiconductor is fabricated, it is preferable to control the single addition amount of the third group element with 1~10 atomic %, or if the third group element and the fifth group element are desired to use as compound addition, it is preferable that the concentration of the third group element should be controlled to be 0.3~5 atomic % more than the fifth group element. If the third group element addition is less than 1 atomic %, the resultant carrier concentration is also less than $10^{19}$ (M/m$^3$).

Hence, the electric resistance is not reduced as expected and the thermal conductivity is still too high, so that the wanted efficiency index can not be achieved. On the contrary, if the addition amount exceeds 10 atomic %, the alloying element is not completely substituted by Si atoms and another type of crystal will be precipitated, so that the Seebeck coefficient is decreased. Hence, in order to obtain the high value of the Seebeck coefficient, the addition amount should be controlled in a range from 1 to 10 atomic %.

On the other hand, if the N type semiconductor is required to be produced, it is preferable to control the addition amount of the fifth group element in a range from 1 to 10 atomic %, or if the third group element and the fifth group element are in compound, it is preferable to control the addition amount of the fifth group element to be 0.3~10 atomic % more than that for the third group element. When the fifth group element concentration is less than 1 atomic %, the resultant carrier concentration is also less than $10^{19}$ (M/m$^3$). Moreover, the electric resistance is not reduced yet, and the thermal conductivity is still high, so that the efficiency index is not improved. On the other hand, if the addition amount exceeds 10.0 atomic %, the alloying element is not completely substituted by Si atoms and another type of crystal will be precipitated, so that the Seebeck coefficient is decreased. Hence, in order to obtain the high value of the Seebeck coefficient, the addition amount should be controlled in a range from 1 to 10.0 atomic %.

Furthermore, the addition amount of the chemical compound semiconductor should be suitably selected in a range from 1 to 10 atomic %. If it is less than 1 atomic %, the resultant carrier concentration is too low, so that the electric conductivity is reduced. On the other hand, if it exceeds 10.0 atomic %, the carrier concentration will become too high, so that the Seebeck coefficient is decreased. Accordingly, the addition amount outside the appropriate window of 1~10 atomic % of addition amount will result in a reduction of the efficiency index.

As a method to reduce the thermal conductivity to less than 100 W/mK at room temperature, a substitution method can be employed in which a portion of Si atoms is substituted by the fourth group element having a different atomic weight. It is suitable to control the addition amount of the fourth group element such as Ge, C, or Sn in a range from 0.1 to 5.0 atomic % in single or compound addition manner. If it exceeds 5.0 atomic %, it is difficult to fabricate the material in a uniform condition. Therefore, it is preferable to control the addition amount in a range from 0.5 to 5.0 atomic %.

According to the present invention, in order to make the Si based P type semiconductor, any element out of the third group element (including Sc, Y, La, Ce, Pr, Nd, Pm, Sm, Eu, Gd, Th, Dy, Ho, Er, Tm, Yb, Lu, B, Al, Ga, In, and Tl) can be used as an alloying element in single or compound addition manner. It is preferable to control the addition amount in a range from 0.1 to 5.0 atomic % in order to achieve the resultant carrier concentration of $10^{19}$~$10^{21}$ (M/m$^3$).

In a case of making the P type semiconductors, if the addition amount of aforementioned in single or compound addition manner is less than 0.1 atomic %, the resultant carrier concentration will become less than $10^{19}$ (M/m$^3$) and the electric resistance is not reduced as expected. Hence the desired efficiency index can not be accomplished. On the contrary, if the addition amount exceeds 5.0 atomic %, a perfect substitution of alloying element with Si atoms can not be achieved in crystals, so that a high level of the Seebeck coefficient can not be obtained. Accordingly, it is preferable to control the addition amount in a range from 0.1 to 5.0 atomic %.

On the other hand, in order to fabricate the N type semiconductors, in single or compound of element(s) properly selected from the fifth group element (including V, Nb, Ta, N, P, As, Sb, and Bi) can be added to Si based material, so that the Seebeck coefficient can be improved. Since it is preferable to control the carrier concentration in a range from $10^{19}$ to $10^{21}$ (M/m$^3$), the addition amount will be suitable if it is in a range from 0.1 to 10.0 atomic %.

In a case when the N type semiconductors are needed to be produced, if the single or compound addition amount of the aforementioned element(s) is less than 0.5 atomic %, the resultant carrier concentration will be less than $10^{19}$ (M/m$^3$), and the electric resistance is not much reduced as expected. On the contrary, if the addition amount exceeds 10.0 atomic %, a perfect substitution of the alloying element with Si atoms in crystals can not be accomplished and the other crystal phase will be precipitated, so that the Seebeck coefficient is reduced. Hence, suitable addition amount should be 0.5~10.0 atomic % in order to obtain the high level of Seebeck coefficient.

3. Composition for alloying elements

Moreover, there are another type of elements than alloying elements A which can be used to produce the P type semiconductors. They include Y, Mo, Zr as transition elements $M_1$. It is possible to control the carrier concentration by either in single or compound addition manner. The addition amount should be controlled in a range from 0.5 to 10.0 atomic % in order to control the resultant carrier concentration in a range from $10^{19}$ to $10^{21}$ (M/m$^3$).

In a case when the P type semiconductors are needed to be fabricated, if the addition amount is less than 0.50 atomic %, the carrier concentration will become less than $10^{19}$ (M/m3), both the electric resistance and thermal conductivity are not reduced much as expected. If the addition amount is controlled within the suitable range from 0.50 to 10.0 atomic %, both the electric resistance and thermal conductivity are reduced; specifically, the thermal conductivity is reduced remarkably (K value of Si at room temperature is 148 W/mK). As a result, a higher value of the efficiency index than that for Si—Ge alloy system can be attained.

Furthermore, if the addition amount exceeds 10.0 atomic %, although both the electric resistance and thermal conductivity are reduced, the Seebeck coefficient is also reduced, resulting in a reduction of the efficiency index. The main reason for the reduction of the Seebeck coefficient is due to the fact that a portion of alloying elements is not substituted with Si atoms in crystals, and another type of crystal will be precipitated. As a consequence, the addition amount should preferably be controlled in a range of 0.5 to 10.0 atomic % in order to obtain the high value of the Seebeck coefficient.

On the contrary, there are another types of alloying elements than the element group B as listed previously in order to produce the N type semiconductors. They are rare earth elements RE (including La, Ce, Pr, Nd, Pm, Sm, Eu, Gd, Th, Dy, Ho, Er, Yb, and Lu) and the transition elements $M_2$ (including Ti, V, Cr, Mn, Fe, Co, Ni, Cu, Nb, Ru, Rh, Pd, Ag, Hf, Ta, W, Re, Os, Ir, Pt, and Au). It is possible to control the carrier concentration by either in single or compound of rare earth elements. As an alternative way to accomplish to control the desired level of the carrier concentration, it can be a compound addition mode of rare earth element and transition element.

For a case when either in single or compound addition manner is employed, it is preferable to control the addition amount in a range from 0.5 to 10.0 atomic % in order to have the resultant carrier concentration in a range of $10^{19}$ to $10^{21}$ (M/m$^3$). For producing the N type semiconductors, if the addition amount is less than 0.5 atomic %, the carrier concentration will become less than $10^{19}$ (M/m$^3$), so that both the electric resistance and thermal conductivity are not reduced as much as expected. The Seebeck coefficient is also not reduced, so that the desired level of the efficiency index can not be achieved.

Moreover, if the addition amount is controlled in a range of 0.5 to 10.0 atomic %, both the electric resistance and thermal conductivity are reduced and specifically the thermal conductivity is rapidly reduced by increasing the addition amount of the rare earth element(s) (K value of Si element at room temperature is 148 W/mK), so that the material shows higher efficiency index than the Si—Ge alloy system exhibits.

If the addition amount exceeds 10.0 atomic %, although both electric resistance and thermal conductivity are reduced, the Seebeck coefficient is also reduced. As a result, the efficiency index is also decreased, which is mainly due to the fact that a perfect substitution of alloying element with Si atoms can not be achieved and another type of crystal phase will be precipitated. Hence, in order to attain the high value of the Seebeck coefficient, the addition amount of alloying element(s) should be controlled in a range from 0.5 to 10.0 atomic %.

4. Production process and rapid cooling

According to the present invention, the alloy which is designed as described in the above is melted, followed by a rapid cooling (quenching) by a cooling metallic pad or a rotating roll to produce a nearly amorphous state. The thus prepared amorphous alloy is then heat treated to finally produce the Si based thermo-electric conversion material. The material is, therefore, normally has a fine grain microstructure and metallic compounds are normally precipitated and distributed. Hence, the carrier of electrons or positive holes moves while hopping these metallic grain boundary compounds, resulting in a reduction of the electric resistance. Since the grain size is fine and the grain boundary precipitates are uniformly distributed, the phonon diffusion such as a heat is easily taken place through the grain boundary scattering, so that the thermal conductivity is also reduced.

Namely, when the designed alloy is not quenched, the grain size will become relatively coarse, metal and half-metal grain boundary phases will partially distributed and precipitated, so that the Seebeck coefficient is reduced greatly in order to cancel the thermo-electromotive force of the semiconductor phase which is generated due to the temperature gradient. As a result, the high value of the thermo-electric properties can not be expected.

On the contrary, if the designed alloy is quenched (or rapid cooled) to form a refined microstructure and precipitate the metallic grain boundary phases, the Seebeck coefficient is not much reduced, and both the electric resistance and thermal conductivity are reduced. As a result, the thermo-electric conversion material with an excellent thermo-electric characteristics can be attained.

According to the present invention, if the average grain size of the thermo-electric conversion material is less than 0.1 μm, the electric resistance will increase due to the distribution of many time metallic grain boundary phases precipitated. If the average grain size exceeds 5 μm, the thermal conductivity will increase. Hence, the preferable average grain size will be in a range of 0.1~5 μm.

EMBODIMENTS

EXAMPLE 1

In order to produce the thermo-electric conversion element as seen in FIG. 1, Al and P as alloying element(s) as listed in Table 1-1 are added to high purity Si(10N), followed by the arc-melting in an argon atmosphere. The obtained button-shaped ingot is cut into a shape as shown in FIG. 1. Hence the P type semiconductors with Al as an alloying element and the N type semiconductor with N as alloying element are fabricated.

Metallic film of Ag, Al or silver solder with the thickness of 10 μm is formed on extruded end portions of each type of semiconductors through the vapor deposition technique. Both semiconductors are squeezed with a ceramic squeezing jig and joined or bonded under the press-bonding conditions listed in Table 1-1.

On the other hand, for the connection between the lead wires and semiconductors, both the other end portions of said semiconductors are coated with a metallic film made of Zn, Ni, Cu, Ag, Au, or Cu-30Zn (brass) through the vapor deposition method with the film thickness of 10 μm. The couple is furthermore squeezed by a ceramic squeezing jig and press-bonded under the bonding conditions as described in Table 1-2. The bonding agent (Alon-alpha: trade name) is applied to the squeezed couple in order to fix the bonded.

The Seebeck coefficient of the thus prepared thermo-electric conversion element is obtained by measuring the thermo-electromotive force (of the thermo-electric element being subjected to a PN-junction) by the digital multi-meter at the average temperature of 200° C. between the high and low temperature sides after setting the temperature difference between the high temperature end and low temperature end to be 6° C. The obtained results are listed in Table 1-2.

EXAMPLE 2

In order to produce the thermo-electric conversion element using the second-sixth group elements as an alloying element, Zn and O with 1.5 atomic % are added to high purity Si (10N) and arc-melted in an argon gas atmosphere. The button-shaped ingot is cut into an identical shape as described in Example 1. Hence, Si based Zn- added P type and O-added N type semiconductors are fabricated as seen in FIG. 1.

The same methods are utilized for the electrode forming, the PN junction and a bonding method as performed for the Example 1 are employed. The same measurement method of the thermo-electric properties as done for the Example 1 are performed. The obtained results are shown in Tables 2-1 and 2-2.

COMPARISON 1

When the thermo-electric conversion element is produced under the same procedures employed for the Example 1, the thermo-electric conversion element for comparison purpose is fabricated by the PN junction which is joined through the vapor deposition using different metals from those listed in Tables 1-2 and 2-2, and connecting lead wires and semi-conductors. The values of Seebeck coefficient which are obtained through the same measuring procedures as previous Examples are listed in Tables 3-1 and 3-2.

EXAMPLE 3

In order to produce the thermo-electric conversion element as shown in FIG. 1, a certain pre-determined amount of element(s) listed in Table 4-1 and 5-1 is added to high purity Si (10N). The designed alloy is arc-melted in an argon atmosphere. The ingot is then quenched by pressing the cooling metallic pad thereon. The shape shown in FIG. 1 is cut from the quenched ingot to make Si based P type semiconductors (No. 20~32) and Si based N type semiconductors (No. 33~47).

Both extruded end surfaces of each P type and N type semiconductor are coated by a metallic film with a film thickness of 10 μm made of Ag, Al, a silver solder through the vapor deposition technique. The couple is squeezed with a ceramic squeezingjig and press-bonded at a temperature of 750° C.~900° C. under a pressure of 150 kg/cm².

For connecting the lead wires and semiconductors, the both end surfaces of both semiconductors are coated with a metallic film of 10 μm thickness made of Zn, Ni, Cu, Ag, Au, or Cu30Zn (brass) through the vapor deposition technique. The couple is squeezed with a ceramic squeezing jig and press-bonded or press-joined at a temperature of 600° C.~1,000° C. under a pressure of 150 kg/cm². The thus bonded couple is furthermore fixed by applying the bonding agent (Alon-alpha: trade name).

The Seebeck coefficient of the thus prepared thermo-electric conversion element is obtained by measuring the thermo-electromotive force (of the thermo-electric element being subjected to a PN-junction) by the digital multi-meter at the average temperature of 200° C. between the high and low temperature ends after setting the temperature difference between the high temperature side and low temperature side to be 6° C. The obtained results are very close data as listed in Tables 4-2 and 5-2.

As seen clearly from Tables 1-2 and 2-2, when making the PN junction of P type and N type semiconductors which both have a diamond structure., it was found that the thermo-electromotive force increases if Ag, Al, or silver solder is used. At the same time, when connecting the lead wires and semiconductors, the thermo-electromotive force will rise if Zn, Ni, Cu, Ag, Au, or Cu-30Zn is used. Therefore, the thermo-electric conversion element with a high generating efficiency (conversion efficiency) can be produced by selecting properly the type of the metal or alloy for joining procedures.

TABLE 1

| No | Alloying element | PN junction | | | |
|---|---|---|---|---|---|
| | | vapor deposition film | | press-bonding conditions | |
| | | Metal | film thickness (μm) | temperature (° C.) | pressure (kg/cm²) |
| Example 1 | | | | | |
| 1 | Al | Ag | 10 | 900 | 150 |
| | P | Ag | 10 | 900 | 150 |
| 2 | Al | Al | 10 | 600 | 150 |
| | P | Al | 10 | 600 | 150 |
| 3 | Al | Silver Solder | 10 | 750 | 150 |
| | P | Silver solder | 10 | 750 | 150 |
| 4 | Al | Ag | 10 | 900 | 150 |
| | P | Ag | 10 | 900 | 150 |
| 5 | Al | Ag | 10 | 900 | 150 |
| | P | Ag | 10 | 900 | 150 |

TABLE 1-continued

| No | Alloying element | Metal | film thickness (μm) | temperature (° C.) | pressure (kg/cm²) | Seebeck coefficient (mV/K) 200° C. |
|---|---|---|---|---|---|---|
| 6 | Al | Ag | 10 | 900 | 150 | |
|   | P  | Ag | 10 | 900 | 150 | |

Connecting semiconductor and lead wire

| No | Alloying element | Metal | vapor deposition film thickness (μm) | press-bonding temperature (° C.) | press-bonding pressure (kg/cm²) | Seebeck coefficient (mV/K) 200° C. |
|---|---|---|---|---|---|---|
| Example 1 | | | | | | |
| 1 | Al | Ni | 10 | — | — | 0.508 |
|   | P  | Ni | 10 | — | — | |
| 2 | Al | Cu | 10 | 1000 | 150 | 0.772 |
|   | P  | Cu | 10 | 1000 | 150 | |
| 3 | Al | Ag | 10 | 900 | 150 | 0.448 |
|   | P  | Ag | 10 | 900 | 150 | |
| 4 | Al | Au | 10 | 1000 | 150 | 0.432 |
|   | P  | Au | 10 | 1000 | 150 | |
| 5 | Al | Zn | 10 | 400 | 150 | 0.446 |
|   | P  | Zn | 10 | 400 | 150 | |
| 6 | Al | Brass | 10 | 800 | 150 | 0.450 |
|   | P  | Brass | 10 | 800 | 150 | |

Note 1) "—" marks in the press-bonding conditions indicate the PN junction is processed by the resin bonding.
Note 2) Brass has a composition of Cu-30Zn.

TABLE 2

PN junction

| No | Alloying element | Metal | vapor deposition film thickness (μm) | press-bonding temperature (° C.) | press-bonding pressure (kg/cm²) |
|---|---|---|---|---|---|
| Example 2 | | | | | |
| 7 | Zn | Ag | 10 | 900 | 150 |
|   | O  | Ag | 10 | 900 | 150 |
| 8 | Zn | Al | 10 | 600 | 150 |
|   | O  | Al | 10 | 600 | 150 |
| 9 | Zn | Silver Solder | 10 | 750 | 150 |
|   | O  | Silver solder | 10 | 750 | 150 |
| 10 | Zn | Ag | 10 | 900 | 150 |
|    | O  | Ag | 10 | 900 | 150 |
| 11 | Zn | Ag | 10 | 900 | 150 |
|    | O  | Ag | 10 | 900 | 150 |
| 12 | Zn | Ag | 10 | 900 | 150 |
|    | O  | Ag | 10 | 900 | 150 |

Connecting semiconductor and lead wire

| No | Alloying element | Metal | vapor deposition film thickness (μm) | press-bonding temperature (° C.) | press-bonding pressure (kg/cm²) | Seebeck coefficient (mV/K) 200° C. |
|---|---|---|---|---|---|---|
| Example 2 | | | | | | |
| 7 | Zn | Ni | 10 | — | — | 0.486 |
|   | O  | Ni | 10 | — | — | |
| 8 | Zn | Cu | 10 | 1000 | 150 | 0.656 |
|   | O  | Cu | 10 | 1000 | 150 | |
| 9 | Zn | Ag | 10 | 900 | 150 | 0.436 |
|   | O  | Ag | 10 | 900 | 150 | |
| 10 | Zn | Au | 10 | 1000 | 150 | 0.408 |
|    | O  | Au | 10 | 1000 | 150 | |

TABLE 2-continued

| 11 | Zn | Zn | 10 | 600 | 150 | 0.430 |
|---|---|---|---|---|---|---|
|    | O  | Zn | 10 | 600 | 150 | |
| 12 | Zn | Brass | 10 | 800 | 150 | 0.442 |
|    | O  | Brass | 10 | 800 | 150 | |

Note 1) "—" marks in the press-bonding conditions indicate the PN junction is processed by the resin bonding.
Note 2) Brass has a composition of Cu-30Zn.

TABLE 3

PN junction

| No | Alloying element | Metal | vapor deposition film thickness (μm) | press-bonding temperature (° C.) | press-bonding pressure (kg/cm²) |
|---|---|---|---|---|---|
| Comparison | | | | | |
| 13 | Al | Zn | 10 | 400 | 150 |
|    | P  | Zn | 10 | 400 | 150 |
| 14 | Al | Pt | 10 | — | — |
|    | P  | Pt | 10 | — | — |
| 15 | Al | Au | 10 | 1000 | 150 |
|    | P  | Au | 10 | 1000 | 150 |
| 16 | Zn | Zr | 10 | — | — |
|    | O  | Zr | 10 | — | — |
| 17 | Zn | Cu | 10 | 1000 | 150 |
|    | O  | Cu | 10 | 1000 | 150 |
| 18 | Zn | Ni | 10 | — | — |
|    | O  | Ni | 10 | — | — |

Connecting semiconductor and lead wire

| No | Alloying element | Metal | vapor deposition film thickness (μm) | press-bonding temperature (° C.) | press-bonding pressure (kg/cm²) | Seebeck coefficient (mV/K) 200° C. |
|---|---|---|---|---|---|---|
| Comparison | | | | | | |
| 13 | Al | Pt | 10 | — | — | 0.326 |
|    | P  | Pt | 10 | — | — | |
| 14 | Al | Zn | 10 | 400 | 150 | 0.268 |
|    | P  | Zn | 10 | 400 | 150 | |
| 15 | Al | Ag | 10 | 900 | 150 | 0.312 |
|    | P  | Ag | 10 | 900 | 150 | |
| 16 | Zn | Ag | 10 | 900 | 150 | 0.168 |
|    | O  | Ag | 10 | 900 | 150 | |
| 17 | Zn | Ni | 10 | — | — | 0.326 |
|    | O  | Ni | 10 | — | — | |
| 18 | Zn | Al | 10 | 600 | 150 | 0.024 |
|    | O  | Al | 10 | 600 | 150 | |

TABLE 4

| No | parent material | alloying element, element | alloying element, amount (at %) | average grain size (μm) |
|---|---|---|---|---|
| Example 3 rapid cooling | | | | |
| 20 | Si | Al | 0.10 | 4.5 |
| 21 | Si | Al | 1.0 | 3.4 |
| 22 | Si | Al | 3.0 | 2.8 |
| 23 | Si | Al | 5.0 | 2.2 |
| 24 | Si | Ga | 3.0 | 3.1 |
| 25 | Si | In | 3.0 | 2.5 |

TABLE 4-continued

| | | | | |
|---|---|---|---|---|
| 26 | Si | Zn | 1.5 | 3.2 |
| 27 | Si | Al | 1.5 | 2.7 |
|    |    | Y  | 0.5 |     |
| 28 | Si | Y  | 3.0 | 4.8 |
| 29 | Si | Mo | 3.0 | 2.2 |
| 30 | Si | Zr | 3.0 | 3.5 |
| 31 | Si | Be | 3.0 | 2.8 |
| 32 | Si | Mg | 3.0 | 4.3 |

Thermo-electric properties

| No | Seebeck coeff. α (mV/K) | Electric resistance ρ (Ωm) | thermal conductivity K (W/mK) | efficiency index Z (1/K) | Carrier concentration (1/cm³) |
|---|---|---|---|---|---|
| Example 3 rapid cooling | | | | | |
| 20 | 0.623 | $1.2 \times 10^{-4}$ | 90 | $3.6 \times 10^{-5}$ | $1.4 \times 10^{18}$ |
| 21 | 0.400 | $2.1 \times 10^{-5}$ | 81 | $9.4 \times 10^{-5}$ | $3.3 \times 10^{19}$ |
| 22 | 0.351 | $1.9 \times 10^{-5}$ | 70 | $9.2 \times 10^{-5}$ | $7.8 \times 10^{20}$ |
| 23 | 0.150 | $7.5 \times 10^{-6}$ | 62 | $4.9 \times 10^{-5}$ | $1.0 \times 10^{21}$ |
| 24 | 0.362 | $1.6 \times 10^{-5}$ | 52 | $1.6 \times 10^{-4}$ | $4.6 \times 10^{20}$ |
| 25 | 0.327 | $1.7 \times 10^{-5}$ | 43 | $1.5 \times 10^{-4}$ | $3.0 \times 10^{20}$ |
| 26 | 0.294 | $1.2 \times 10^{-5}$ | 48 | $1.5 \times 10^{-4}$ | $6.3 \times 10^{20}$ |
| 27 | 0.366 | $2.0 \times 10^{-5}$ | 41 | $1.6 \times 10^{-4}$ | $4.1 \times 10^{20}$ |
| 28 | 0.332 | $1.6 \times 10^{-5}$ | 46 | $1.5 \times 10^{-4}$ | $3.8 \times 10^{20}$ |
| 29 | 0.308 | $2.1 \times 10^{-5}$ | 42 | $1.1 \times 10^{-4}$ | $1.2 \times 10^{20}$ |
| 30 | 0.218 | $1.5 \times 10^{-5}$ | 42 | $7.5 \times 10^{-5}$ | $2.1 \times 10^{20}$ |
| 31 | 0.360 | $1.1 \times 10^{-5}$ | 77 | $1.5 \times 10^{-4}$ | $5.4 \times 10^{20}$ |
| 32 | 0.320 | $1.3 \times 10^{-5}$ | 65 | $1.2 \times 10^{-4}$ | $3.2 \times 10^{20}$ |

TABLE 5

| No | parent material | alloying element, element | alloying element, amount (at %) | average grain size (μm) |
|---|---|---|---|---|
| Example 3 rapid cooling | | | | |
| 33 | Si | P  | 0.10 | 4.8 |
| 34 | Si | P  | 1.0  | 3.6 |
| 35 | Si | P  | 3.0  | 2.9 |
| 36 | Si | P  | 5.0  | 1.5 |
| 37 | Si | Sb | 3.0  | 3.4 |
| 38 | Si | Bi | 3.0  | 2.3 |
| 39 | Si | P  | 1.5  | 2.5 |
|    |    | Nd | 0.5  |     |
| 40 | Si | Bi | 1.5  | 2.8 |
|    |    | Dy | 0.5  |     |
| 41 | Si | Cr | 3.0  | 3.1 |
| 42 | Si | Fe | 3.0  | 2.5 |
| 43 | Si | Nb | 3.0  | 4.3 |
| 44 | Si | Ag | 3.0  | 4.8 |
| 45 | Si | Nd | 3.0  | 1.2 |
| 46 | Si | La | 3.0  | 1.5 |
| 47 | Si | Fe | 1.5  | 2.0 |
|    | Si | La | 1.5  |     |

Thermo-electric properties

| No | Seebeck coeff. α (mV/K) | Electric resistance 92 (Ωm) | thermal conductivity K (W/mK) | efficiency index Z (1/K) | Carrier concentration (1/cm³) |
|---|---|---|---|---|---|
| Example 3 rapid cooling | | | | | |
| 33 | 0.530 | $1.3 \times 10^{-5}$ | 85 | $2.5 \times 10^{-4}$ | $1.1 \times 10^{19}$ |
| 34 | 0.320 | $3.2 \times 10^{-6}$ | 41 | $3.1 \times 10^{-4}$ | $2.8 \times 10^{20}$ |
| 35 | 0.230 | $0.8 \times 10^{-6}$ | 31 | $2.2 \times 10^{-4}$ | $4.3 \times 10^{20}$ |
| 36 | 0.120 | $0.4 \times 10^{-6}$ | 24 | $9.4 \times 10^{-5}$ | $5.6 \times 10^{20}$ |
| 37 | 0.278 | $2.4 \times 10^{-6}$ | 48 | $1.7 \times 10^{-4}$ | $2.4 \times 10^{20}$ |
| 38 | 0.245 | $8.9 \times 10^{-6}$ | 32 | $2.1 \times 10^{-4}$ | $3.3 \times 10^{20}$ |
| 39 | 0.296 | $1.2 \times 10^{-5}$ | 30 | $2.4 \times 10^{-4}$ | $1.1 \times 10^{20}$ |
| 40 | 0.230 | $1.8 \times 10^{-5}$ | 27 | $1.1 \times 10^{-4}$ | $1.5 \times 10^{20}$ |
| 41 | 0.202 | $1.8 \times 10^{-5}$ | 52 | $4.3 \times 10^{-5}$ | $2.0 \times 10^{20}$ |
| 42 | 0.276 | $1.2 \times 10^{-5}$ | 40 | $1.6 \times 10^{-4}$ | $3.1 \times 10^{20}$ |
| 43 | 0.215 | $1.3 \times 10^{-5}$ | 39 | $9.1 \times 10^{-5}$ | $3.3 \times 10^{20}$ |
| 44 | 0.308 | $0.88 \times 10^{-6}$ | 35 | $3.1 \times 10^{-4}$ | $3.6 \times 10^{20}$ |
| 45 | 0.369 | $1.8 \times 10^{-5}$ | 28 | $2.7 \times 10^{-4}$ | $1.7 \times 10^{20}$ |
| 46 | 0.332 | $2.1 \times 10^{-5}$ | 30 | $1.8 \times 10^{-4}$ | $1.3 \times 10^{20}$ |
| 47 | 0.320 | $1.6 \times 10^{-5}$ | 41 | $1.6 \times 10^{-4}$ | $1.5 \times 10^{20}$ |

INDUSTRIAL APPLICABILITY

With the thermo-electric conversion element according to the present invention, the power generating efficiency (in other words, the conversion efficiency) can be improved by inserting as metallic film made of either Ag, Al, or silver soldering material for the PN junction formation between the Si based P type and N type semiconductors, and inserting a metallic film made of either Zn, Ni, Cu, Ag, Au, or Cu-30Zn at a connecting portion between the semiconductors and lead wires, so that the electromotive power and the thermo-electromotive force are not cancelled each other due to the Schottky barrier which is generated at the interfacial area between the metals and semiconductors. The desired thermo-electric conversion efficiency can be achieved by the material presented in this invention without any deterioration of the original thermo-electric properties.

While this invention has been described with respect to preferred embodiments and examples, it should be understood that the invention is not limited to that precise examples; rather many modifications and variations would present themselves to those of skill in the art without departing from the scope and spirit of this invention, as defined in the appended claims.

What is claimed is:

1. A thermo-electric conversion element comprising a P type semiconductor which is produced by adding additional elements to an Si base material and an N type semiconductor which is produced by adding additional elements to an Si based material; one end portion of respective said semiconductors being formed in a PN junction by bonding through at least one metal or alloy selected from a material selected from the group consisting of Ag, Al and silver solder, and the other end portions thereof as electrodes for lead side being connected to lead wires through one or more metals or alloys selected from a material selected from the group consisting of Zn, Ni, Cu, Ag, and Au.

2. The thermo-electric conversion element according to claim 1, wherein said P type semiconductor contains at least one element from the element group, referred as an additional element α, as a P type semiconductor former with more than 0.001 atomic % and at least one element from the element group, referred to as an alloying element β, as an N type semiconductor former with more than 0.001 atomic %, the total addition amount of these P type and N type semiconductor forming elements being in a range from 0.002 to 20 atomic %, and the total addition amount of the additional element α is contained more than that of the additional element β, so that the P type semiconductor can be produced.

3. The thermo-electric conversion element according to claim 1, wherein said N type semiconductor contains at least one element from the element group, referred to as an additional element α, as a P type semiconductor former with more than 0.001 atomic % and at least one element from the element group, referred to as additional element β, as an N type semiconductor former with more than 0.001 atomic %, the total addition amount of these P type and N type semiconductor forming elements is in a range from 0.002 to 20 atomic %, and the total addition amount of the additional element β is contained more than that of the additional element α, so that the N type semiconductor can be produced.

4. The thermo-electric conversion element according to claim 2 or 3, wherein the P type semiconductor forming alloying element α is one or more than two elements with an addition amount ranging from 0.001 atomic % to 20 atomic % being properly selected from element groups of alloying element A selected from the group consisting of Be, Mg, Ca, Sr, Ba, Zn, Cd, Hg, B, Al, Ga, In, and Tl and the transition metal element $M_1$ selected from the group consisting of Y, Mo and Zr, and the N type semiconductor forming additional element β is one or more than two elements with an addition amount ranging from 0.001 atomic % to 20 atomic % being properly selected from element groups of alloying element B selected from the group consisting of N, P, As, Sb, Bi, O, S, Se, and Te, transition metal element M2 selected from the group consisting of Ti, V, Cr, Mn, Fe, Co, Ni, Cu, Nb, Ru, Rh, Pd, Ag, Hf, Ta, W, Re, Os, Ir, Pt, and Au, and rare earth element RE selected from the group consisting of La, Ce, Pr, Nd, Pm, Sm, Eu, Gd, Tb, Dy, Ho, Er, Yb, and Lu.

5. The thermo-electric conversion element according to claim 1, wherein an average grain size is in a range from 0.1 μm to 5 μm.

6. The thermo-electric conversion element according to claim 1, wherein the semiconductor microstructure is consisted of a semiconductor crystalline phase and the metallic or semi-metallic conductor grain boundary phase which is distributed in the bulk.

7. The thermo-electric conversion element according to claim 1, wherein a carrier concentration is in a range of $10^{17} \sim 10^{21}$ (M/m$^3$).

8. The thermo-electric conversion element according to claim 1, wherein a porosity is in a range of 5~40%.

9. The thermo-electric conversion element according to claim 1, wherein the P type semiconductor is produced by adding at least one of element properly selected from the alloying element A selected from the group consisting of Be, Mg, Ca, Sr, Ba, Zn, Cd, Hg, B, Al, Ga, In and Tl to Si based material with an addition amount range of 0.001~0.5 atomic % and the resultant carrier concentration is in a range from $10^{17}$ to $10^{20}$ (M/m$^3$).

10. The thermo-electric conversion element according to claim 9, wherein the average grain size is in a range-of 0.1 μm~5 μm.

11. The thermo-electric conversion element according to claim 9, wherein the semiconductor microstructure is consisted of a semiconductor crystalline phase and the metallic or semi-metallic conductor grain boundary phase which is distributed in the bulk.

12. The thermo-electric conversion element according to claim 9, wherein the porosity is in a range from 5 to 40%.

13. The thermo-electric conversion element according to claim 1, wherein the P type semiconductor is produced by adding at least one of element properly selected from the alloying element A selected from the group consisting of Be, Mg, Ca, Sr, Ba, Zn, Cd, Hg, B, Al, Ga, In and Tl to Si based material with an addition amount range of 0.5~5.0 atomic % and the resultant carrier concentration is in a range from $10^{19}$ to $10^{21}$ (M/m$^3$).

14. The thermo-electric conversion element according to claim 1, wherein the N type semiconductor is produced by adding at least one of element properly selected from alloying element B selected from the group consisting of N, P, As, Sb, Bi, O, S, Se, and Te to Si based material with an addition amount range of 0.001~0.5 atomic % and the resultant carrier concentration is in a range from $10^{17}$ to $10^{20}$ (M/m$^3$).

15. The thermo-electric conversion element according to claim 1, wherein the N type semiconductor is produced by adding at least one of element properly selected from the alloying element B including N, P, As, Sb, Bi, O, S, Se, and Te to Si based material with an addition amount range of 0.5~10 atomic % and the resultant carrier concentration is in a range from $10^{17}$ to $10^{20}$ (M/M$^3$).

16. The thermo-electric conversion element according to claim 1, wherein the P type semiconductor contains at least one each element properly selected from the alloying element A selected from the group consisting of Be, Mg, Ca, Sr, Ba, Zn, Cd, Hg, B, Al, Ga, In and Tl and alloying element B selected from the group consisting of N, P, As, Sb, Bi, O, S, Se, and Te with a total addition amount range of 1~20 atomic % and the addition amount of selected alloying element A is contained 0.3~5 atomic % more than that of selected alloying element B, so that the resultant carrier concentration is controlled in a range from $10^{19}$ to $10^{21}$ (M/m$^3$) and the thermal conductivity at room temperature is less than 100 W/mK.

17. The thermo-electric conversion element according to claim 1, wherein the N type semiconductor contains at least one each element properly selected from the alloying element A selected from the group consisting of Be, Mg, Ca, Sr, Ba, Zn, Cd, Hg, B, Al, Ga, In and Tl and alloying element B selected from the group consisting of N, P, As, Sb, Bi, O, S, Se, and Te with a total addition amount range of 1~20 atomic % and the addition amount of selected alloying element B is contained 0.3~10 atomic % more than that of selected alloying element A, so that the resultant carrier concentration is controlled in a range from $10^{19}$ to $10^{21}$ (M/m$^3$) and the thermal conductivity at room temperature is less than 100 W/mK.

18. The thermo-electric conversion element according to claim 1, wherein the P type semiconductor contains 1~10 atomic % of the third-fifth group chemical compound semiconductor or the second-sixth group chemical compound semiconductor, and at least one each element properly selected from the alloying element A selected from the group consisting of Be, Mg, Ca, Sr, Ba, Zn, Cd, Hg, B, Al, Ga, In and Tl, so that the resultant carrier concentration is in a range from $10^{19}$ to $10^{21}$ (M/m$^3$) and the thermal conductivity at room temperature is less than 100 W/mK.

19. The thermo-electric conversion element according to claim 1, wherein the N type semiconductor contains 1~10 atomic % of third-fifth group chemical compound semiconductor or second-sixth group chemical compound semiconductor, and at least one each element properly selected from the alloying element B selected from the group consisting of N, P, As, Sb, Bi, O, S, Se, and Te so that the resultant carrier concentration is in a range from $10^{19}$ to $10^{21}$ (M/m$^3$) and the thermal conductivity at room temperature is less than 100 W/mK.

20. The thermo-electric conversion element according to claim 1, wherein the P type semiconductor contains 0.1~5 atomic % of at least one element selected from the group consisting of Ge, C, and Sn, and more than 0.001 atomic % in single or compound of element properly selected from the alloying element A selected from the group consisting of Be, Mg, Ca, Sr, Ba, Zn, Cd, Hg, B, Al, Ga, In and Tl, so that the thermal conductivity at room temperature is less than 100 W/mK.

21. The thermo-electric conversion element according to claim 20, wherein the addition amount of at least one of properly selected alloying element A is in a range of 0.5~5.0 atomic %, so that the resultant carrier concentration is in a range from $10^{19}$ to $10^{21}$ (M/m$^3$).

22. The thermo-electric conversion element according to claim 1, wherein the N type semiconductor contains 0.1~5 atomic % of at least one element selected from the group consisting of Ge, C, and Sn, and more than 0.001 atomic % at least one of element properly selected from the alloying element B selected from the group consisting of N, P, As, Sb, Bi, O, S, Se, and Te so that the thermal conductivity at room temperature is less than 100 W/mK.

23. The thermo-electric conversion element according to claim 22, wherein the addition amount of of at least one of properly selected alloying element B is in a range of 0.5~10 atomic %, so that the resultant carrier concentration is in a range from $10^{19}$ to $10^{21}$ (M/m$^3$).

24. The thermo-electric conversion element according to claim 1, wherein the P type semiconductor contains 0.5~10 atomic % of at least one of element properly selected from transition alloying metal element $M^1$ selected from the group consisting of Y, Mo, and Zr, so that the resultant carrier concentration is in a range of $10^{19}$ to $10^{21}$ (M/m$^3$).

25. The thermo-electric conversion element according to claim 1, wherein the N type semiconductor contains 0.5~10 atomic % of at least one of properly selected element from the rare earth element group RE selected from the group consisting of La, Ce, Pr, Nd, Pm, Sm, Eu, Gd, Tb, Dy, Ho, Er, Yb, and Lu, so that the resultant carrier concentration is in a range of $10^{19}$ to $10^{21}$ (M/m$^3$).

26. The thermo-electric conversion element according to claim 1, wherein the N type semiconductor contains 0.5~10 atomic % of at least one of properly selected element from the transition metal elements $M_2$ selected from the group consisting of Ti, V, Cr, Mn, Fe, Co, Ni, Nb, Ru, Rh, Pd, Ag, Hf, Ta, W, Re, Os, Ir, Pt and Au, which should be less than 10 atomic %, so that the resultant carrier concentration is in a range of $10^{19}$ to $10^{21}$ (M/m$^3$).

27. The thermo-electric conversion element according to claim 1, wherein the N type semiconductor contains at least one element properly selected from the transition metal elements M2 selected from the group consisting of Ti, V, Cr, Mn, Fe (which should be less than 10 atomic %), Co, Ni, Nb, Ru, Rh, Pd, Ag, Hf, Ta, W, Re, Os, Ir, Pt and Au, and at least one element properly selected from the rare earth element RE selected from the group consisting of La, Ce, Pr, Nd, Pm, Sm, Eu, Gd, Tb, Dy, Ho, Er, Yb, and Lu and the total addition amount is in range of 0.5~10 atomic %, so that the resultant carrier concentration is in a range of $10^{19}$ to $10^{21}$ (M/m$^3$).

28. The thermo-electric conversion element according to claim 1, wherein the P type semiconductor contains at least one each element properly selected from the alloying element A selected from the group consisting of Be, Mg, Ca, Sr, Ba, Zn, Cd, Hg, B, Al, Ga, In, and Tl and the transition metal element M1 selected from the group consisting of Y, Mo, and Zr and the total addition amount is in a range of 1~10 atomic %, so that the resultant carrier concentration is in a range of $10^{19}$ to $10^{21}$ (M/m$^3$).

29. The thermo-electric conversion element according to claim 1, wherein the P type semiconductor contains at least one each element properly selected from the alloying element A selected from the group consisting of Be, Mg, Ca, Sr, Ba, Zn, Cd, Hg, B, Al, Ga, In, and Tl and the transition metal element M1 selected from the group consisting of Y, Mo, and Zr and the rare earth element RE selected from the group consisting of La, Ce, Pr, Nd, Pm, Sm, Eu, Gd, Tb, Dy, Ho, Er, Yb, and Lu, and the total addition amount is in a range of 1~10 atomic %, so that the resultant carrier concentration is in a range of $10^{19}$ to $10^{21}$ (M/M$^3$).

30. The thermo-electric conversion element according to claim 1, wherein the N type semiconductor contains at least one each element properly selected from the alloying element B selected from the group consisting of N, P, As, Sb, Bi, O, S, Se, and Te and the transition metal element $M_2$ selected from the group consisting of Ti, V, Cr, Mn, Fe, Co, Ni, Cu, Nb, Ru, Rh, Pd, Ag, Hf, Ta, W, Re, Os, Ir, Pt, and Au, Fe should be less than 10 atomic %, and the total addition amount is in a range of 1~10 atomic %, so that the resultant carrier concentration is in a range of $10^{19}$ to $10^{21}$ (M/m$^3$).

31. The thermo-electric conversion element according to claim 1, wherein the N type semiconductor contains at least one each element properly selected from the alloying element B selected from the group consisting of N, P, As, Sb, Bi, O, S, Se, and Te and the rare earth element RE selected from the group consisting of La, Ce, Pr, Nd, Pm, Sm, Eu, Gd, Tb, Dy, Ho, Er, Yb, and Lu and the total addition amount is in a range of 1~10 atomic %, so that the resultant carrier concentration is in a range of $10^{19}$ to $10^{21}$ (M/m$^3$).

32. The thermo-electric conversion element according to claim 1, wherein the N type semiconductor contains at least one each element properly selected from the alloying element B selected from the group consisting of N, P, As, Sb, Bi, O, S, Se, and Te and the transition metal element $M_2$ selected from the group consisting of Ti, V, Cr, Mn, Fe, Co, Ni, Cu, Nb, Ru, Rh, Pd, Ag, Hf, Ta, W, Re, Os, Ir, Pt, and Au, Fe should be less than 10 atomic %, and the rare earth element RE selected from the group consisting of La, Ce, Pr, Nd, Pm, Sm, Eu, Gd, Tb, Dy, Ho, Er, Yb, and Lu and the total addition amount is in a range of 1~10 atomic %, so that the resultant carrier concentration is in a range of $10^{19}$ to $10^{21}$ (M/m$^3$).

* * * * *